United States Patent
Takahashi et al.

(10) Patent No.: US 6,376,151 B1
(45) Date of Patent: Apr. 23, 2002

(54) POSITIVE RESIST COMPOSITION (75) Inventors: Hideaki Takahashi; Masashi Kimura; Takahiro Sasaki, all of Fuji (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/673,019

(22) PCT Filed: Apr. 15, 1999

(86) PCT No.: PCT/JP99/02002

§ 371 Date: Oct. 10, 2000

§ 102(e) Date: Oct. 10, 2000

(87) PCT Pub. No.: WO99/54787

PCT Pub. Date: Oct. 28, 1999

(30) Foreign Application Priority Data

Apr. 15, 1998 (JP) .............................. 10-105098
Dec. 1, 1998 (JP) .............................. 10-342090
Dec. 1, 1998 (JP) .............................. 10-342091

(51) Int. Cl.⁷ ..................... G03F 7/023; G03F 7/30; C08G 69/32
(52) U.S. Cl. .................. 430/192; 430/193; 430/326; 430/330; 528/335
(58) Field of Search ................ 430/192, 193, 430/326, 330; 528/335

(56) References Cited

U.S. PATENT DOCUMENTS 5,037,720 A * 8/1991 Khanna ........................ 430/190
5,376,499 A * 12/1994 Hammerschmidt et al. . 430/192
5,449,584 A * 9/1995 Banba et al. ................. 430/190
5,486,447 A * 1/1996 Hammerschmidt et al. . 430/197
6,143,467 A * 11/2000 Hsu et al. ................... 430/270.1
6,177,225 B1 * 6/2001 Weber et al. ................ 430/190

FOREIGN PATENT DOCUMENTS

| JP | A6396162 | 4/1988 |
| JP | A387745 | 4/1991 |
| JP | A5197153 | 8/1993 |
| JP | A7128846 | 5/1995 |
| JP | A9127696 | 5/1997 |
| JP | A11100501 | 4/1999 |

* cited by examiner

Primary Examiner—John S. Chu
(74) Attorney, Agent, or Firm—Birch, Stewart, Kolasch & Birch, LLP (57) ABSTRACT A positive resist composition comprising a hydroxypolyamide represented by the following general formula (I) and a photoactive component:

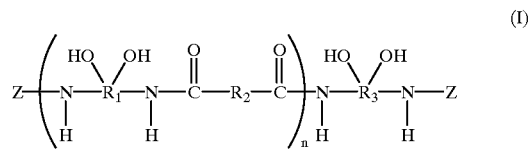

(wherein $R_1$ and $R_3$ may be the same or different and are each a tetravalent aromatic group; $R_2$ is a bivalent aromatic group; n is an integer of 2 to 150; and Z is a monovalent organic group and at least 40% of Z is a group represented by the following structural formula (II):

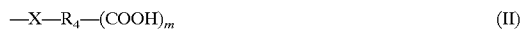

(wherein X is a carbonyl group or a sulfonyl group; m is an integer of 0 to 3 with a proviso that m is not 0 when X is a carbonyl group; $R_4$ is an aliphatic group not including alkenyl group or alkynyl group, an alicyclic group or an aromatic group; and, when X is a carbonyl group and $R_4$ is an alicyclic group or an aromatic group, at least one of the carboxylic groups is at the ortho position)).

7 Claims, 1 Drawing Sheet

FIG. 1

POSITIVE RESIST COMPOSITION

This application is the national phase under 35 U.S.C. §371 of PCT International Application No. PCT/JP99/02005 which has an International filing date of Apr. 15, 1999, which designated the United States of America.

TECHNICAL FIELD

The present invention relates to a positive resist composition containing an alkali-soluble hydroxy-polyamide which functions as a precursor for heat-resistant resin material; to a hydroxypolyamide suitable for use in the composition; and to a method for formation of a heat-resistant pattern using the positive resist composition.

BACKGROUND ART

Polyimide resins superior in heat resistance, electrical properties, mechanical properties, etc. have heretofore been used in the surface protective film and interlayer dielectric of semiconductor device. These polyimide resins are generally provided in the form of a photosensitive polyimide precursor composition, can easily form a pattern by subjecting the composition to treatments such as coating, patterning by actinic ray, development, thermal imidization and the like, and have the feature that they allow for significantly fewer operational steps as compared to conventional light-insensitive polyimides.

In the development step of the photosensitive polyimide precursor composition, it is necessary to use a large amount of an organic solvent (e.g. N-methyl-2-pyrrolidone) as a developing solution. Due to the increased concern in recent years for environmental problems, a measure for developing without the use of the organic solvent is being sought. In this connection, various proposals have recently been made for a heat-resistant photosensitive resin material which is developable with a dilute aqueous alkali solution similarly to photoresists.

Of these proposals, a method using an aqueous alkali-soluble hydroxypolyamide (e.g. polybenzoxazole (PBO) precursor) in combination with a photoactive component (e.g. quinone diazide) has drawn attention in recent years (JP-A-63-96162, etc.).

These resins can easily form a positive pattern when subjected to light exposure and development with an aqueous alkali solution, have good developability and storage stability, and exhibit heat-cured film properties equal to those of polyimides; therefore, they are drawing attention as a promising substitute material for organic solvent-developable polyimide precursor. However, the PBO precursors developed by the methods disclosed heretofore have a number of problems.

In general, the PBO precursor is obtained by polycondensation between a hydroxydiamine and a dicarboxylic acid or a derivative thereof, but ordinarily has an amino group at the polymer terminals for the polymer stability and handling. A PBO precursor having amino groups at the terminals, however, has a problem in that it deteriorates the diazoquinone compound used together as a photosensitive material in a positive resist composition and greatly reduces the stability of the composition. In order to alleviate this problem, it was proposed to modify the terminal amino groups. For example, it was proposed to block the terminal amino groups in the form of an aromatic amide by using benzoyl chloride or the like, though this proposal was made for a negative composition (see JP-A-7-128846). When such a polymer whose terminals are simply blocked in the form of an aromatic amide, is used in a positive composition, the positive composition has improved stability; however, the cured film obtained from the composition is very weak and has problematic mechanical properties. In order to alleviate the problem, there was proposed a method of modifying the polymer terminal groups with a unsaturated bond-containing group such as alkenyl (e.g. norbornene), alkynyl or the like (see JP-A-5-197153). Certainly, with this method, the resulting composition has improved stability and, after the heat-curing of the composition, the unsaturated bond-containing group gives rise to formation of a network structure and consequent formation of a film superior in mechanical properties and adhesivity. Such a method of introducing an unsaturated group into polymer terminals has been widely used in thermosetting polyimides, etc.; however, the linkage formed thereby takes a form in which aliphatic chains are connected and, therefore, is generally insufficient in heat resistance. For example, when subjected to a heat treatment at a high temperature of 350° C. or higher, the linkage is cleaved, thereby resulting in a significant reduction in film properties and adhesivity to the base material. The lack of reliability is a big problem when the polymer is used as a protective film for a semiconductor device.

The increased integration of electronic parts such as semiconductor integrated circuits and the like is striking, and the wiring structure employed in such parts has become more multilayered. In that connection, the reproducibility of the pattern in heat-curing of the interlayer dielectric and/or surface protective film has become more important. In using a PBO precursor-containing positive resist, however, no film fully satisfactory in pattern reproducibility is obtained during the thermal treatment.

As in conventional cases, polymer flow takes place during curing and there appears a problem of pattern deformation, for example, covering of the pattern bottom or decrease in opening area of the pattern bottom.

DISCLOSURE OF THE INVENTION (1) The present invention aims at providing a heat-resistant positive resist composition which can form a positive pattern by light exposure and development with an aqueous alkali solution, which is highly stable even when combined with a diazoquinone compound, and which satisfies at a high level the heat resistance and dynamic properties required for use in the surface protective film and interlayer dielectric of semiconductor device; and a hydroxypolyamide suitably used in such a composition.

(2) The present invention also aims at providing a positive resist composition capable of giving a pattern significantly improved in shape deformation when heat-cured.

(3) The present invention further aims at providing a method for forming a heat-resistant pattern by using the above positive resist composition.

The present inventors made an intensive study in order to achieve, by paying attention to the terminal groups of a hydroxypolyamide used as an alkali-soluble PBO precursor in a positive resist composition, the prevention of deterioration of a diazoquinone compound used in the positive resist composition together with the hydroxy-polyamide and further the formation of a film superior in heat resistance and other properties. As a result, the present inventors found out that the above task (1) could be achieved by converting the terminal amino groups of the hydroxypolyamide into terminal groups of a particular structure.

The present inventors also found out that the above task (2) could be achieved by allowing the hydroxypolyamide having particular terminal structures, to have a particular polymer structure which shows no glass transition temperature (Tg) at least at 400° C. or below, that is, has a Tg higher than the curing temperature.

The first aspect of the present invention is a positive resist composition comprising a hydroxypolyamide represented by the following general formula (I) and a photoactive component:

(wherein $R_1$ and $R_3$ may be the same or different and are each a tetravalent aromatic group; $R_2$ is a bivalent aromatic group; n is an integer of 2 to 150; and Z is a monovalent organic group and at least 40% of Z is a group represented by the following structural formula (II):

$$-X-R_4-(COOH)_m \quad (II)$$

wherein X is a carbonyl group or a sulfonyl group; m is an integer of 0 to 3 with a proviso that m is not 0 when X is a carbonyl group; $R_4$ is an aliphatic group not including alkenyl group or alkynyl group, an alicyclic group or an aromatic group; and, when X is a carbonyl group and $R_4$ is an alicyclic group or an aromatic group, at least one of the carboxylic groups is at the ortho position).

As the photoactive component used herein, a photosensitive diazoquinone compound is preferred.

In the first aspect of the present invention, the X in the structural formula of the Z of the general formula (I) is particularly preferably a sulfonyl group because excellent mechanical properties are exhibited at temperatures lower than 350° C., for example, even at 320° C.

In the general formula (I) of hydroxypolyamide, $R_1$ and $R_3$ are each preferably the following group because there can be obtained a positive resist composition capable of forming a pattern significantly improved in shape deformation during heat curing:

The second aspect of the present invention is a hydroxypolyamide suitably used in the positive resist composition of the above first invention and is a hydroxypolyamide represented by the following general formula (III) (the second invention):

(wherein $R_1$ and $R_3$ may be the same or different and are each a tetravalent aromatic group; $R_2$ is a bivalent aromatic group; n is an integer of 2 to 150; and Z is a monovalent organic group and at least 40% of Z is a group represented by the following structural formula (IV):

$$-X-R_4-(COOH)_m \quad (IV)$$

wherein X is a sulfonyl group; m is an integer of 0 to 3; and $R_4$ is an aliphatic group not including alkenyl group or alkynyl group, an alicyclic group or an aromatic group)].

The third aspect of the present invention is a method for forming a heat-resistant pattern (the third invention), which comprises coating, on a semiconductor device, the positive resist composition of the first invention, then subjecting the coated material to prebaking, light exposure and development for patterning, and heat-curing the resulting coating film pattern.

BEST MODE FOR CARRYING OUT THE INVENTION

In order to obtain the hydroxypolyamide used in the present invention, first, an aromatic dicarboxylic acid or a derivative is subjected to polycondensation with a bis(o-aminophenol).

As the dicarboxylic acid having a bivalent aromatic group $R_2$ or the derivative thereof, used in the present invention, there can be mentioned phthalic acid, isophthalic acid, terephthalic acid, 4,4'-diphenyl ether dicarboxylic acid, 3,4'-diphenyl ether dicarboxylic acid, 3,3'-diphenyl ether dicarboxylic acid, 4,4'-biphenyldicarboxylic acid, 4,4'-benzophenonedicarboxylic acid, 4,4'-hexafluoroisopropylidenedibenzoic acid, 4,4,'-dicarboxydiphenylamide, 1,4-phenylenediethanoic acid, 1,1-bis(4-carboxyphenyl)-1-phenyl-2,2,2-trifluoroethane, bis(4-carboxyphenyl) sulfide, bis(4-carboxyphenyl) tetraphenyldisiloxane, bis(4-carboxyphenyl) tetramethyldisiloxane, bis(4-carboxyphenyl)sulfone, bis(4-carboxyphenyl)methane, 5-tert-butylisophthalic acid, 5-bromoisophthalic acid, 5-fluoroisophthalic acid, 5-chloroisophthalic acid, 2,2-bis(p-carboxyphenyl)propane, 4,4,'-(p-phenylenedioxy)dibenzoic acid, 2,6-naphthalenedicarboxylic acid, chlorides of these acids, active esters of these acids with hydroxybenztriazole or the like, etc. The dicarboxylic acid or the derivative thereof is not restricted to the above compounds. They can be used singly or in admixture.

As the bis(o-aminophenol) having tetravalent aromatic groups $R_1$ and $R_3$, used in the present invention, there can be mentioned, for example, 3,3'-dihydroxybenzidine, 3,3'-diamino-4,4'-dihydroxybiphenyl, 3,3'-dihydroxy-4,4'-diaminodiphenylsulfone, bis-(3-amino-4-hydroxyphenyl) methane, 2,2-bis(3-amino-4-hydroxyphenyl)propane, 2,2-bis(3-amino-4-hydroxyphenyl)hexafluoropropane, 2,2-bis(3-hydroxy-4-aminophenyl)hexafluoropropane, bis(3-hydroxy-4-aminophenyl)methane, 2,2-bis(3-hydroxy-4-aminophenyl)propane, 3,3'-dihydroxy-4,4'-diaminobenzophenone, 3,3,'-dihydroxy-4,4,'-diaminodiphenyl ether, 4,4,'-dihydroxy-3,3'-diaminodiphenyl ether, 2,5-dihydroxy-1,4-diaminobenzene and 4,6-diaminoresorcinol. The bis(o-aminophenol) is not restricted to the above compounds.

The hydroxypolyamide of the present invention is a polycondensate composed of the above raw materials and, when an aromatic dicarboxylic acid chloride or an active ester of an aromatic dicarboxylic acid is used, can be obtained by mixing it with a bis(o-aminophenol) in the presence of a basic compound (e.g. pyridine) in an appropriate solvent.

When an aromatic dicarboxylic acid is used, however, an appropriate condensation agent is required. As the condensation agent, a known dehydration and condensation agent can be used. There can be mentioned, for example, dicyclohexylcarbodiimide, 1-ethoxycarbonyl-2-ethoxy-1,2-dihydroquinoline, 1,1'-carbonyldioxy-di-1,2,3-benztriazole, N,N'-disuccinimidyl carbonate and phosphorous esters. When dicyclohexylcarbodiimide is used, it is preferably used together with 1-hydroxy-1,2,3-benztriazole.

By the above methods is obtained a polymer having amino group at the two terminals, after which the terminal amino groups of the polymer are blocked by any of the following methods to obtain a hydroxypolyamide having a terminal structure specified by the present invention.

(1) The terminal amino groups are subjected to condensation with a sulfonating agent (e.g. methanesulfonyl chloride, p-toluenesulfonyl chloride or 2-nitrobenzenesulfonyl chloride) to block the amino groups in the form of sulfonamide group.

(2) The terminal amino groups are subjected to condensation with phthalic acid anhydride and/or its derivative (e.g. 4-methylphthalic acid anhydride or 4-chlorophthalic acid anhydride) to block the amino groups in the form of phthalic acid-combined amino group.

(3) The terminal amino groups are subjected to condensation with a saturated aliphatic hydrocarbon-based cyclic acid anhydride (e.g. succinic acid anhydride, 2-formamidosuccinic acid anhydride, methylsuccinic acid anhydride, 2,2-dimethylsuccinic acid anhydride, acetoxysuccinic acid anhydride, acetylmercaptosuccinic acid anhydride, glutaric acid anhydride, 3-methylglutaric acid anhydride, 2,2-dimethylglutaric acid anhydride or 3,3-dimethylglutaric acid anhydride) to block the amino groups in a state that an aliphatic acid is bonded to the polymer terminals in the form of free amidocarboxylic acid group.

Examples of the amide blocking group Z used herein are preferably the followings groups when the X of the structural formula (II) or (IV) is a sulfonyl group:

and the followings groups when the X is a carbonyl group:

The ratio of terminal blocking in the form of amide must be 40 mole % or more of the total terminal amine groups, with 60 mole % or more being preferred.

A ratio of terminal blocking in the form of amide, smaller than 40 mole % is not preferred because, when the hydroxypolyamide is formulated into a positive resist, the resist is unable to fully exhibit excellent storage stability, lithography property and cured film property which are the meritorious effects of the present invention.

As the organic solvent used in the above reaction, a polar solvent is generally preferred which completely dissolves the hydroxypolyamide formed. There can be mentioned, for example, N-methyl-2-pyrrolidone, N,N-dimethylacetamide, N,N-dimethylformamide, dimethyl sulfoxide, tetramethylurea and γ-butyrolactone. Besides these polar solvents, there can also be used ordinary organic solvents, i.e. ketones, esters, lactones, ethers, halogenated hydrocarbons and hydrocarbons, such as acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene and xylene.

The reaction product can be used in a resist composition, as it is. As necessary, it can be used after purification by adding it to water or a poor solvent (e.g. methanol) to hydroxypolyamide and repeating reprecipitation.

The positive resist composition of the second invention can be obtained by allowing the above hydroxypolyamide to contain a photoactive component.

The photosensitive diazoquinone compound used as such a photoactive component is a compound having a 1,2-benzoquinone diazide or 1,2-naphthoquinone diazide structure and is a known substance in U.S. Pat. Nos. 2,772,972, 2,797,213, 3,669,658, etc. Specific examples of such a compound include the followings.

-continued

In the above formulas, Q is selected from the group consisting of hydrogen atom, and, in each compound, at least one Q is The positive resist composition may further contain, as necessary, additives such as phenolic compound, leveling agent, silane coupling agent and the like. The positive resist composition is used with the above-mentioned photosensitive material and additives dissolved in a solvent in the form of varnish.

As the above solvent, there can be mentioned N-methyl-2-pyrrolidone, N,N-dimethylacetamide, N,N-dimethylformamide, γ-butyrolactone, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl 3-methoxypropionate, etc. These solvents can be used singly or in admixture.

The method for forming a heat-resistant pattern according to the third invention is conducted according to the following steps using the above-obtained varnish.

First, the composition is coated on a semiconductor wafer. As the method for coating, there are mentioned spin coating using a spinner, spray coating using a spray coater, dipping, printing, roll coating, etc. In the spin coating, the thickness of the film formed can easily be controlled by varying the rpm of the spinner, and the final film thickness after curing is made to 0.1 to 20 μm. Then, the coating film is prebaked at 60 to 130° C. for drying and then an actinic ray is applied in a desired pattern. As the actinic ray, there can be used an X ray, an electron beam, a ultraviolet light, a visible light or the like; however, a light having a wavelength of 200 to 500 nm is preferred. Then, the exposed portion is dissolved and removed using a developing solution to obtain a relief pattern.

As the developing solution, there can be suitably used an aqueous solution of an alkali such as inorganic alkali (e.g. sodium hydroxide, potassium hydroxide, sodium carbonate, sodium silicate, sodium metasilicate or ammonia water), primary amine (e.g. ethylamine or n-propylamine), secondary amine (e.g. diethylamine or di-n-propylamine), tertiary amine (e.g. triethylamine or methyldimethylamine), alcoholamine (e.g. dimethylethanolamine or triethanol-amine), quaternary ammonium salt (e.g. tetramethylammonium hydroxide or tetraethylammonium hydroxide) or the like; or an aqueous solution obtained by adding thereto appropriate amounts of an alcohol (e.g. methanol or ethanol) and a surfactant. As the method for development, there can be used spraying, paddling, dipping, ultrasonic wave, etc.

Next, the relief pattern formed by development is rinsed. As the rinsing solution, distilled water is used. Then, a heat treatment is conducted at 300 to 400° C., whereby an oxazole ring-containing pattern superior in heat resistance can be obtained.

Hereinafter, specific embodiments of the present invention are described by way of Examples.

EXAMPLES AND COMPARATIVE EXAMPLES OF SULFONAMIDE TERMINALS

Example 1

In a separable flask of 2-liter capacity were mixed, at room temperature (25° C.) with stirring, 370 g of N,N-dimethylacetamide (DMAc), 26.90 g (0.34 mol) of pyridine and 61.53 g (0.17 mol) of 2,2-bis(3-amino-4-hydroxyphenyl)hexafluoropropane to dissolve the diamine. Thereto was dropwise added, from a dropping funnel, a solution of 28.42 g (0.14 mol) of isophthalic acid dichloride dissolved in 114 g of diethylene glycol dimethyl ether (DMDG). At that time, the separable flask was cooled in a water bath of 15 to 20° C. The time required for the dropwise addition was 20 minutes and the highest temperature of the reaction mixture was 30° C.

The reaction mixture was allowed to stand, with stirring, for 60 minutes from the completion of the dropwise addition. Thereto were added 6.87 g (0.06 mol) of methanesulfonyl chloride and 4.75 g (0.06 mol) of pyridine. The resulting mixture was allowed to stand, with stirring, at 20 to 25° C. for 15 hours, to block 100% of the terminal amino groups of the polymer formed, with methanesulfonyl groups. The conversion can be easily calculated by tracing the residual portion of the methanesulfonyl chloride added, by high performance liquid chromatography (HPLC).

Then, the reaction mixture was dropwise added to and dispersed in 5 liters of water with stirring at a high speed, to precipitate a polymer. The polymer was recovered, washed with water appropriately, dehydrated and vacuum-dried to obtain a hydroxypolyamide (SA-1).

When the purification of the above polymer was necessary, the purification could be conducted by the following method. That is, the purification was conducted by redissolving the above-obtained polymer in 300 g of γ-butyrolactone (GBL), washing the resulting polymer solution with deionized water, then passing the washed polymer through a GBL-substituted glass column packed with 90 g of a cation exchange resin and 185 g of an anion exchange resin. The thus-purified polymer solution was dropwise added to 5 liters of deionized water, and the precipitated polymer was separated, washed and vacuum-dried, whereby a purified polymer could be obtained.

Example 2

A hydroxypolyamide (SA-2) whose polymer terminal groups were 100% converted into sulfonamide groups, was obtained by conducting the same operation as in Example 1 except that the aromatic dicarboxylic acid chloride used was changed to 41.32 g (0.14 mol) of 4,4'-diphenyl ether dicarboxylic acid dichloride.

Example 3

In a separable flask of 2-liter capacity were mixed, at room temperature (25° C.) with stirring, 375 g of N,N-dimethylacetamide (DMAc), 31.64 g (0.40 mol) of pyridine, 54.94 g (0.15 mol) of 2,2-bis(3-amino-4-hydroxyphenyl)hexafluoropropane and 10.81 g (0.05 mol) of 3,3'-dihydroxy-4,4'-diaminobiphenyl to dissolve the diamines. Thereto was dropwise added, from a dropping funnel, a solution of 32.48 g (0.16 mol) of isophthalic acid dichloride dissolved in 114 g of DMDG. At that time, the separable flask was cooled in a water bath of 15 to 20° C. The time required for the dropwise addition was 25 minutes and the highest temperature of the reaction mixture was 28° C.

The reaction mixture was allowed to stand, with stirring, for 60 minutes from the completion of the dropwise addition. Thereto were added 15.25 g (0.08 mol) of p-toluenesulfonyl chloride and 6.33 g (0.08 mol) of pyridine. The resulting mixture was allowed to stand, with stirring, at 20 to 25° C. for 15 hours, to block 100% of the terminal amine groups of the polymer formed, with p-toluenesulfonyl groups. The subsequent operation was conducted in the same manner as in Example 1, to obtain a hydroxypolyamide (SA-3).

Comparative Example 1

A hydroxypolyamide (AM-1) whose molecular chain terminals remained as amino groups, was produced by conducting the same operation as in Example 1 except that no methanesulfonyl chloride was added to the reaction mixture after the completion of the polycondensation reaction.

Comparative Example 2

A hydroxypolyamide (SA-4) having a ratio of blocking in the form of sulfonamide, of 19.9% as determined by HPLC was obtained by conducting the same operation as in Example 1 except that, in the terminal blocking, the amount of methanesulfonyl chloride added was changed to 1.37 g (0.012 mol) and the amount of pyridine added was changed to 0.95 g (0.012 mol).

Comparative Example 3

A hydroxypolyamide (BZ-1) was obtained in the same manner as in Example 1 except that, in the terminal blocking, methanesulfonyl chloride was changed to 8.43 g (0.06 mol) of benzoyl chloride.

Comparative Example 4

A hydroxypolyamide (NB-1) was obtained in the same manner as in Example 1 except that, in the terminal blocking, methanesulfonyl chloride was changed to 19.70 g (0.12 mol) of 5-norbornene-2,3-dicarboxylic acid anhydride.

The polymers obtained in the above Examples and Comparative Examples were each confirmed, by the $^1$H-NMR spectra, to have the intended structure. For example, in the polymer obtained in Comparative Example 1, a peak of the aromatic amine of molecular chain terminal was seen at 4.78 ppm; meanwhile, in the polymer obtained in Example 1, that peak was not seen and instead a peak of the methyl group of methanesulfonyl group appeared at 2.92 ppm.

EXAMPLES AND COMPARATIVE EXAMPLES OF AROMATIC CARBOXYLIC ACID TERMINALS

Example 4

In a separable flask of 2-liter capacity were mixed, at room temperature (25° C.) with stirring, 370 g of N,N-dimethylacetamide (DMAc), 34.01 g (0.43 mol) of pyridine and 61.53 g (0.17 mol) of 2,2-bis(3-amino-4-hydroxyphenyl)hexafluoropropane to dissolve the diamine. Thereto was dropwise added, from a dropping funnel, a solution of 30.45 g (0.15 mol) of isophthalic acid dichloride dissolved in 177 g of diethylene glycol dimethyl ether (DMDG). At that time, the separable flask was cooled in a water bath of 15 to 20° C. The time required for the dropwise addition was 25 minutes and the highest temperature of the reaction mixture was 26° C.

The reaction mixture was allowed to stand, with stirring, for 60 minutes from the completion of the dropwise addition. Thereto was added 11.85 g (0.08 mol) of phthalic acid anhydride in a solid state. The resulting mixture was allowed to stand, with stirring, at 20 to 25° C. for 10 hours, to condense 100 mole % of the terminal amino groups of the polymer formed, with phthalic acid anhydride. The conversion can be easily calculated by tracing the residual portion of the phthalic acid anhydride added, by high performance liquid chromatography (HPLC).

Then, to the stirred reaction mixture was dropwise added a mixed solvent consisting of 600 g of deionized water and 400 g of isopropanol, to reprecipitate the intended polymer. The precipitated polymer was collected and mixed with 300 g of N-methyl-2-pyrrolidone (NMP) to redissolve the polymer. Thereafter, purification by ion exchange was conducted in the same manner as in Example 1.

The reaction mixture after the purification by ion exchange was dropwise added to 5 liters of deionized water with stirring at a high speed, to precipitate a polymer in a dispersed state. The polymer was recovered, washed with water appropriately, dehydrated, and then vacuum-dried at 50° C. for 24 hours to obtain an aromatic hydroxypolyamide (PH-1) having a weight-average molecular weight (a polystyrene-reduced value in a developing solvent of tetrahydrofuran, the same applies hereinafter) of 18,000 as measured by GPC.

Example 5

An aromatic hydroxypolyamide (PH-2) having a weight-average molecular weight of 18,000 as measured by GPC was obtained by conducting the same operation as in Example 4 except that the aromatic dicarboxylic acid derivative was changed from isophthalic acid dichloride to 44.27 g (0.15 mol) of 4,4'-diphenyl ether dicarboxylic acid dichloride.

Comparative Example 5

An aromatic hydroxypolyamide (NH-1) whose molecular chain terminals remained as amino groups, was produced, for comparison, by conducting the same operation as in Example 4 except that no phthalic acid anhydride was added to the reaction mixture after the completion of the polycondensation reaction. The polymer had a weight-average molecular weight of 17,800 as measured by GPC.

Comparative Example 6

An aromatic hydroxypolyamide (PS-1) having a weight-average molecular weight of 18,200 as measured by GPC and a ratio of blocking in the form of a phthalic acid-combined amino group, of 33.6 mole % as measured by HPLC was obtained by conducting the same operation as in Example 4 except that the amount of phthalic acid anhydride added was changed to 2.22 g (0.015 mol).

Comparative Example 7

An aromatic hydroxypolyamide (NB-2) having a weight-average molecular weight of 18,100 as measured by GPC was obtained by conducting the same operation as in Example 4 except that phthalic acid anhydride was changed to 13.13 g (0.08 mol) of 5-norbornene-2,3-dicarboxylic acid anhydride.

Comparative Example 8

An aromatic hydroxypolyamide (ML-1) having a weight-average molecular weight of 18,000 as measured by GPC was obtained by conducting the same operation as in Example 4 except that phthalic acid anhydride was changed to 7.85 g (0.08 mol) of maleic acid anhydride.

The polymers obtained in the above Examples and Comparative Examples were each confirmed, by the IR spectra, to have the intended structure. For example, in the polymer obtained in Example 4, peaks showing the presence of carboxyl group were seen at 1,716 cm$^{-1}$ and 1,766 cm$^{-1}$; however, these peaks were not seen in the polymer of Comparative Example 1.

EXAMPLES OF ALIPHATIC CARBOXYLIC ACID TERMINALS

Example 6

In a separable flask of 2-liter capacity were mixed, at room temperature (25° C.) with stirring, 370 g of N,N-dimethylacetamide (DMAc), 26.90 g (0.34 mol) of pyridine and 61.53 g (0.17 mol) of 2,2-bis(3-amino-4-hydroxyphenyl)hexafluoropropane to dissolve the diamine. Thereto was dropwise added, from a dropping funnel, a solution of 28.42 g (0.14 mol) of isophthalic acid dichloride dissolved in 114 g of diethylene glycol dimethyl ether (DMDG). At that time, the separable flask was cooled in a water bath of 15 to 20° C. The time required for the dropwise addition was 20 minutes and the highest temperature of the reaction mixture was 30° C.

The reaction mixture was allowed to stand, with stirring, for 60 minutes from the completion of the dropwise addition. Thereto were added 12.01 g (0.12 mol) of succinic acid anhydride and 9.49 g (0.12 mol) of pyridine. The resulting mixture was allowed to stand, with stirring, at 20 to 25° C. for 15 hours, to block 90% of the terminal amino groups of the polymer formed, by forming a succinamide group. The conversion can be easily calculated by tracing the residual portion of the succinic acid anhydride added, by high performance liquid chromatography (HPLC).

Then, the reaction mixture was dropwise added to 5 liters of water with stirring at a high speed, to precipitate a polymer in a dispersed state. The polymer was recovered, washed with water appropriately, dehydrated and vacuum-dried to obtain a hydroxypolyamide (AL-1).

When the purification of the above polymer was necessary, the purification could be conducted by the following method. That is, the purification was conducted by redissolving the above-obtained polymer in 300 g of γ-butyrolactone (GBL), washing the resulting polymer solution with deionized water, then passing the washed polymer through a GBL-substituted glass column packed with 90 g of a cation exchange resin and 185 g of an anion exchange resin. The thus-purified polymer solution was dropwise added to 5 liters of deionized water, and the precipitated polymer was separated, washed and vacuum-dried, whereby a purified polymer could be obtained.

Example 7

A hydroxypolyamide (AL-2) whose polymer terminal groups were 98% converted into glutaramide groups, was obtained by conducting the same operation as in Example 6 except that the aromatic dicarboxylic acid chloride used was changed to 41.32 g (0.14 mol) of 4,4'-diphenyl ether dicarboxylic acid dichloride and the blocking agent for the terminal amino groups was changed to 13.69 g (0.12 mol) of glutaric acid anhydride.

Example 8

A hydroxypolyamide (AL-3) whose polymer terminal groups were 92% converted into succinamide groups, was obtained by conducting the same operation as in Example 6 except that the aromatic dicarboxylic acid chloride used was changed to 48.05 g (0.14 mol) of 4,4'-diphenylsulfondicarboxylic acid dichloride.

Example 9

In a separable flask of 2-liter capacity were mixed, at room temperature (25° C.) with stirring, 375 g of N,N-dimethylacetamide (DMAc), 31.64 g (0.40 mol) of pyridine, 54.94 g (0.15 mol) of 2,2-bis(3-amino-4-hydroxyphenyl) hexafluoropropane and 10.81 g (0.05 mol) of 3,3'-dihydroxy-4,4'-diaminobiphenyl to dissolve the diamines. Thereto was dropwise added, from a dropping funnel, a solution of 32.48 g (0.16 mol) of isophthalic acid dichloride dissolved in 114 g of DMDG. At that time, the separable flask was cooled in a water bath of 15 to 20° C. The time required for the dropwise addition was 25 minutes and the highest temperature of the reaction mixture was 28° C.

The reaction mixture was allowed to stand, with stirring, for 60 minutes from the completion of the dropwise addition. Thereto were added 18.26 g (0.16 mol) of glutaric acid anhydride and 12.66 g (0.16 mol) of pyridine. The resulting mixture was allowed to stand, with stirring, at 20 to 25° C. for 15 hours, to block 98% of the terminal amino groups of the polymer formed, in the form of glutaramide groups. The subsequent operation was conducted in the same manner as in Example 1, to obtain a hydroxypolyamide (AL-4).

Comparative Example 9

A hydroxypolyamide (AM-2) wherein the molecular chain terminals remained to amino group, was produced by conducting the same operation as in Example 6 except that no succinic acid anhydride was added to the reaction mixture after the completion of the polycondensation reaction.

Comparative Example 10

A hydroxypolyamide (AL-5) wherein the ratio of blocking in the form of succinamide group was 20.0% as measured by HPLC, was obtained by conducting the same operation as in Example 6 except that, in terminal blocking, the amount of succinic acid anhydride added was changed to 3.00 g (0.03 mol) and the amount of pyridine added was changed to 2.37 g (0.03 mol).

Comparative Example 11

A hydroxypolyamide (BZ-2) was obtained in the same manner as in Example 6 except that, in terminal blocking, 8.43 g (0.06 mol) of benzoyl chloride was used in place of succinic acid anhydride.

Comparative Example 12

A hydroxypolyamide (ML-2) was obtained in the same manner as in Example 6 except that, in terminal blocking, 11.77 g (0.12 mol) of maleic acid anhydride was used in place of succinic acid anhydride.

The polymers obtained in the above Examples and Comparative Examples were each confirmed, by the $^1$H-NMR spectra, to have an intended structure. For example, in the polymer obtained in Comparative Example 9, a peak of the aromatic amine of molecular chain terminal was seen at 4.78 ppm; meanwhile, in the polymer obtained in Example 7, that peak was not seen and instead peaks of the three methylene groups of glutaric acid appeared at 1.79 ppm, 2.26 ppm and 2.43 ppm.

Evaluation of Physical Properties

Using the polymers obtained in the above Examples and Comparative Examples, respective positive resist compositions were prepared and evaluated for varnish viscosity stability, patterning property, and mechanical properties of heat-cured film.

First, 100 parts by weight of each polymer, 25 parts by weight of a photosensitive material (structure: shown below) and 0.02 part by weight of a leveling agent (Megafac R-08, a product of Dainippon Ink and Chemicals, Incorporated) were dissolved in 160 parts by weight of GBL. Then, the resulting solution was filtered through a 0.2 μm filter to prepare a photosensitive resin composition.

-continued (1) Evaluation of Viscosity Stability

Each photosensitive composition prepared above was measured for viscosity after filtration and after one-week standing at room temperature by using an E type viscometer, and the results are shown in Tables 1 and 2 together with the viscosity change.

TABLE 1

| Polymer | SA-1 | SA-2 | SA-3 | AM-1 | SA-4 | BZ-1 | NB-1 |
|---|---|---|---|---|---|---|---|
| Initial viscosity | 25.3 | 20.4 | 22.5 | 23.3 | 24.6 | 26.4 | 26.7 |
| Viscosity after one week at room temperature | 25.7 | 20.7 | 22.9 | 26.9 | 27.4 | 27.0 | 27.2 |
| Viscosity change | +1.5 | +1.3 | +1.9 | +15.6 | +11.4 | +2.3 | +1.8 |

TABLE 2

| Polymer | AL-1 | AL-2 | AL-3 | AL-4 | AM-2 | AL-5 | BZ-2 | ML-2 |
|---|---|---|---|---|---|---|---|---|
| Initial viscosity | 26.1 | 22.2 | 23.5 | 24.1 | 25.3 | 25.8 | 26.4 | 26.0 |
| Viscosity after one week at room temperature | 26.5 | 22.4 | 23.8 | 24.5 | 29.2 | 28.6 | 27.0 | 26.4 |
| Viscosity change | +1.4 | +1.1 | +1.3 | +1.8 | +15.6 | +10.9 | +2.3 | +1.5 |

Unit of viscosity: poise
Unit of viscosity change: %

Regarding Examples and Comparative Examples of Sulfonamide Terminals

It is clear from the results of Table 1 that P-3 to SA-1 and BZ-1 to NB-1 wherein the polymer terminal amino groups are modified to sulfonamide group or the like, show excellent viscosity stability. Meanwhile, AM-1 wherein the polymer terminals are amino group and SA-4 wherein the terminal amino groups are insufficiently modified, show large viscosity changes and had a problem in safety.

Regarding Examples and Comparative Examples of Aliphatic Carboxylic Acid Terminals It is clear from the results that AL-1 to AL-4, BZ-2 and ML-1 wherein the polymer terminal amino groups are modified to carboxylic acid amide group or the like, show excellent viscosity stability. Meanwhile, AM-1 wherein the polymer terminals are amino group and AL-5 wherein the terminal amino groups are insufficiently modified, show large viscosity changes and have low stability.

(2) Evaluation of Film Mechanical Properties

Heat-cured films were produced from the above photosensitive compositions, and measured for mechanical properties. That is, each varnish was uniformly coated on a silicon wafer using a spin coater; the coated varnish was prebaked on a hot plate of 100° C. for 240 seconds; thereby, a film sample having a thickness of about 15 μm was prepared. This sample was set in a vertical curing oven (a product of Koyo Lindberg Ltd.) and subjected to heat curing in a nitrogen atmosphere at 350° C. for 2 hours to obtain a heat-resistant film of polybenzoxazole (PBO).

This cured film was peeled from the silicon wafer and its mechanical properties were evaluated by ASTM D-882-88. The results are shown in Table 3, Table 4 and Table 5.

TABLE 3

| polymer | Cured film thickness (μm) | Maximum stress (MPa) | Young's modulus (kg/mm$^2$) | Elongation at break (%) |
|---|---|---|---|---|
| SA-1 | 10.0 | 136.3 | 2.4 | 50.8 |
| SA-2 | 9.8 | 133.7 | 2.3 | 54.5 |
| SA-3 | 9.7 | 138.3 | 2.5 | 49.6 |
| BZ-1 | 10.1 | 121.7 | 2.3 | 6.3 |
| NB-1 | 10.0 | 127.3 | 2.5 | 20.7 |

TABLE 4

| polymer | Cured film thickness (μm) | Maximum stress (MPa) | Young's modulus (kg/mm$^2$) | Elongation at break (%) |
|---|---|---|---|---|
| PH-1 | 9.9 | 156.1 | 2.1 | 79.8 |
| PH-2 | 10.1 | 160.4 | 2.2 | 88.7 |
| NH-1 | 10.0 | 120.2 | 2.5 | 45.3 |
| PS-1 | 9.8 | 137.3 | 2.6 | 25.4 |
| NB-2 | 9.9 | 132.3 | 2.4 | 16.9 |
| ML-1 | 10.0 | 126.5 | 2.8 | 22.7 |

TABLE 5

| polymer | Cured film thickness (μm) | Maximum stress (MPa) | Young's modulus (kg/mm$^2$) | Elongation at break (%) |
|---|---|---|---|---|
| AL-1 | 10.0 | 130.8 | 2.4 | 50.2 |
| AL-2 | 9.8 | 128.9 | 2.3 | 51.3 |
| AL-3 | 9.7 | 127.8 | 2.3 | 51.0 |
| AL-4 | 10.1 | 135.3 | 2.4 | 49.1 |
| BZ-2 | 10.0 | 121.7 | 2.3 | 6.3 |
| ML-2 | 9.8 | 131.2 | 2.3 | 16.8 |

The photosensitive composition obtained from the polymer (SA-1) obtained in Example 1 was evaluated for mechanical properties also when heat-cured at a lower temperature of 320° C. for 2 hours in a nitrogen atmosphere. As a result, the elongation at break was 48.2%.

Regarding the Examples and Comparative Examples of Sulfonamide Terminals

It is clear from these results that the polymers SA-1 to SA-3 whose terminal groups were modified to sulfonamide group, showed excellent mechanical properties (particularly, elongation). In contrast, the polymers whose terminals were modified with benzoyl group (BZ-1) or norbornene group (NB-1), gave, in 350° C. curing, films which were insufficient in elongation and weak. The polymer whose terminals are modified to sulfonamide group, shows sufficient elongation even in 320° C. curing; therefore, the polymer show excellent mechanical properties over a wide temperature range.

Regarding the Examples and Comparative Examples of Aromatic Carboxylic Acid Terminals The compositions using the polymers of the present Examples gave films which were very flexible in mechanical properties.

Regarding the Examples and Comparative Examples of Aliphatic Carboxylic Acid Terminals It is clear from these results that the polymers AL-1 to AL-3 whose terminal groups were modified to aliphatic carboxylic acid group, showed excellent mechanical properties (particularly, elongation). In contrast, the polymers whose terminals were modified with benzoyl group (BZ-2) or maleic acid group (ML-2), gave, in 350° C. curing, films which were insufficient in elongation and weak.

(3) Evaluation of Patterning

The photosensitive polymer compositions which proved to show excellent varnish viscosity stability and mechanical properties in the above evaluations, were each coated on a Si wafer and prebaked in the same manner as in the above sample preparation for evaluation of its mechanical properties, to obtain a coating film having an as-prebaked film thickness of 10 μm. To the film was applied, through a reticle having a test pattern, a light at a dose of 500 mJ/cm$^2$ using an i-line stepper (a product of Nikon Corporation). The film after light exposure was subjected to development using a developing solution (NMD-3, a product of Tokyo Ohka Kogyo Co., Ltd.) (a 2.38% aqueous tetramethylammonium hydroxide (TMAH) solution), to dissolve and remove the exposed portion. Successively, rinsing was conducted with purified water for 20 seconds to stop the dissolution, whereby a sample for pattern evaluation was produced.

The sample was observed for resolution, residue, etc. visually under an optical microscope, and examined for resolution at the development time when a finest and good pattern (in through-hole, line and space, etc.) was obtained. Also, the film thickness of unexposed portion before and after development was measured and the residual film ratio of unexposed portion (unit: %; 100% refers to no change in film thickness before and after light exposure) was calculated. The results are shown in Table 6, Table 7 and Table 8.

TABLE 6

| Polymer | Optimum development time (sec) | Resolution (μm) | Residual film ratio at unexposed portion (%) |
|---|---|---|---|
| SA-1 | 110 | 5 | 94 |
| SA-2 | 160 | 5 | 96 |
| SA-3 | 120 | 5 | 95 |

TABLE 7

| Polymer | Optimum development time (sec) | Resolution (μm) | Residual film ratio at unexposed portion | Others |
| --- | --- | --- | --- | --- |
| PH-1 | 60 | 5 | 92 | |
| PH-2 | 70 | 5 | 96 | |
| NH-1 | ∞ | — | — | Swelling occurred; residue remained undissolved; and development was impossible. |
| PS-1 | 240 | 15 | 74 | Dissolution was insufficient; much residue remained. |
| NB-2 | 190 | 20 | 76 | Much residue remained undissolved; and resolution was low. |
| ML-1 | 220 | 25 | 71 | Same as above. |

TABLE 8

| Polymer | Optimum development time (sec) | Resolution (μm) | Residual film ratio at unexposed portion (%) |
| --- | --- | --- | --- |
| AL-1 | 90 | 5 | 91 |
| AL-2 | 120 | 5 | 94 |
| AL-3 | 120 | 5 | 95 |
| AL-4 | 100 | 5 | 92 |

With the compositions using the polymers of the present Examples, the resolution and residual film ratio were excellent when development was performed using a 2.38% aqueous TMAH solution.

As is clear from the above results, the photosensitive composition using the polymer of the present invention has excellent patterning property and excellent varnish viscosity stability, is very flexible in mechanical properties, and can find practical applications in the surface protective film and interlayer dielectric of semiconductor device.

Example 10

In a separable flask of 1-liter capacity were mixed, at room temperature (25° C.) with stirring, 250 g of N,N-dimethylacetamide (DMAc), 31.8 g (0.4 mol) of pyridine, 41.7 g (0.196 mol) of 4,6-diaminoresorcinol and 20 g of lithium chloride (LiCl) to dissolve the diamine. Thereto was dropwise added, from a dropping funnel with water cooling, a solution of 52.0 g (0.176 mol) of 4,4'-diphenyl ether dicarboxylic acid dichloride dissolved in 200 g of diethylene glycol dimethyl ether (DMDG). The time required for the dropwise addition was 20 minutes and the temperature of the reaction mixture was 30° C.

The reaction mixture was allowed to stand, with stirring, for 120 minutes from the completion of the dropwise addition. Thereto were added 5.9 g (0.04 mol) of phthalic acid anhydride and 35.6 g (0.45 mol) of pyridine. The resulting mixture was allowed to stand, with stirring, at 20 to 25° C. for 15 hours, to block 90% of the terminal amino groups of the polymer formed, in the form of phthalamide group. The conversion can be easily calculated by tracing the residual portion of the phthalic acid anhydride added, by high performance liquid chromatography (HPLC).

Then, the reaction mixture was dropwise added to 5 liters of water with stirring at a high speed, to precipitate a polymer in a dispersed state. The polymer was recovered and redissolved in NMP. The resulting solution was dropwise added to water with stirring; the water was removed; and vacuum drying was conducted at 50° C. to obtain a polymer.

Using the polymer, a positive resist composition was prepared in the same manner as in Example 1 except that there was used, as the naphthoquinone diazide compound, a compound obtained by esterifying 50 mole % of the hydroxyl groups of 2,3,4,4'-tetrahydroxybenzophenone with 6-diazo-5-oxo-5,6-dihydronaphthalene-1-sulfonic acid, in an amount of 15% by weight relative to the polymer. The composition was spin-coated on a wafer and dried in an oven of 80° C. for 80 minutes to form a coating film of 10 μm in thickness. To this coating film was applied a light for 60 seconds for patterning, using a contact aligner (PAL501F, a 200 w ultrahigh pressure mercury lamp, a product of CANON INC.). The resulting wafer was subjected to development using an aqueous tetramethylammonium hydroxide (TMAH) solution as a developing solution and water as a rinsing solution, whereby a pattern of the precursor was obtained. The wafer was subjected to a heat treatment in a nitrogen atmosphere at 200° C. for 30 minutes and further at 400° C. for 1 hour, using a programmed temperature elevation type curing oven (VF-2000, a product of Koyo Lindberg Ltd.), to obtain a pattern of polybenzoxazole having a film thickness of 5 μm.

Evaluation of Heat-cured Pattern

Measurement of Line Width of Pattern

The above-obtained pattern was measured for shape and pattern bottom opening width before and after curing, using a line width measurement system, Caliper Vision, produced by Soft Works K.K. As a result, the pattern bottom opening width after curing at 400° C. for 1 hour was the same as before the curing and the flow and deformation of the pattern caused by heating could be significantly improved.

Evaluation of Tg of Heat-cured Film

Vibron Measurement

The photosensitive composition obtained in Example 10 was spin-coated on a 5-inch silicon wafer so that the film thickness after curing became about 10 μm, and heated at 350° C. for 2 hours to obtain a coating film of polybenzoxazole. The polybenzoxazole coating film was peeled from the wafer using hydrofluoric acid; a polybenzoxazole tape was made and cut into a film size of 3 mm (width) and 4 cm; and the 3-cm central portion of the film was measured using a dynamic viscoelasticity tester, DDV-01FP, produced by Orientec Co., in a temperature range of −150 to 400° C. at a driving frequency of 110 Hz at a temperature elevation rate of 5° C./min. As a result, no main dispersion (α dispersion) appeared at least at 400° C. or below.

Thermomechanical Analysis (TMA)

Figure 1:
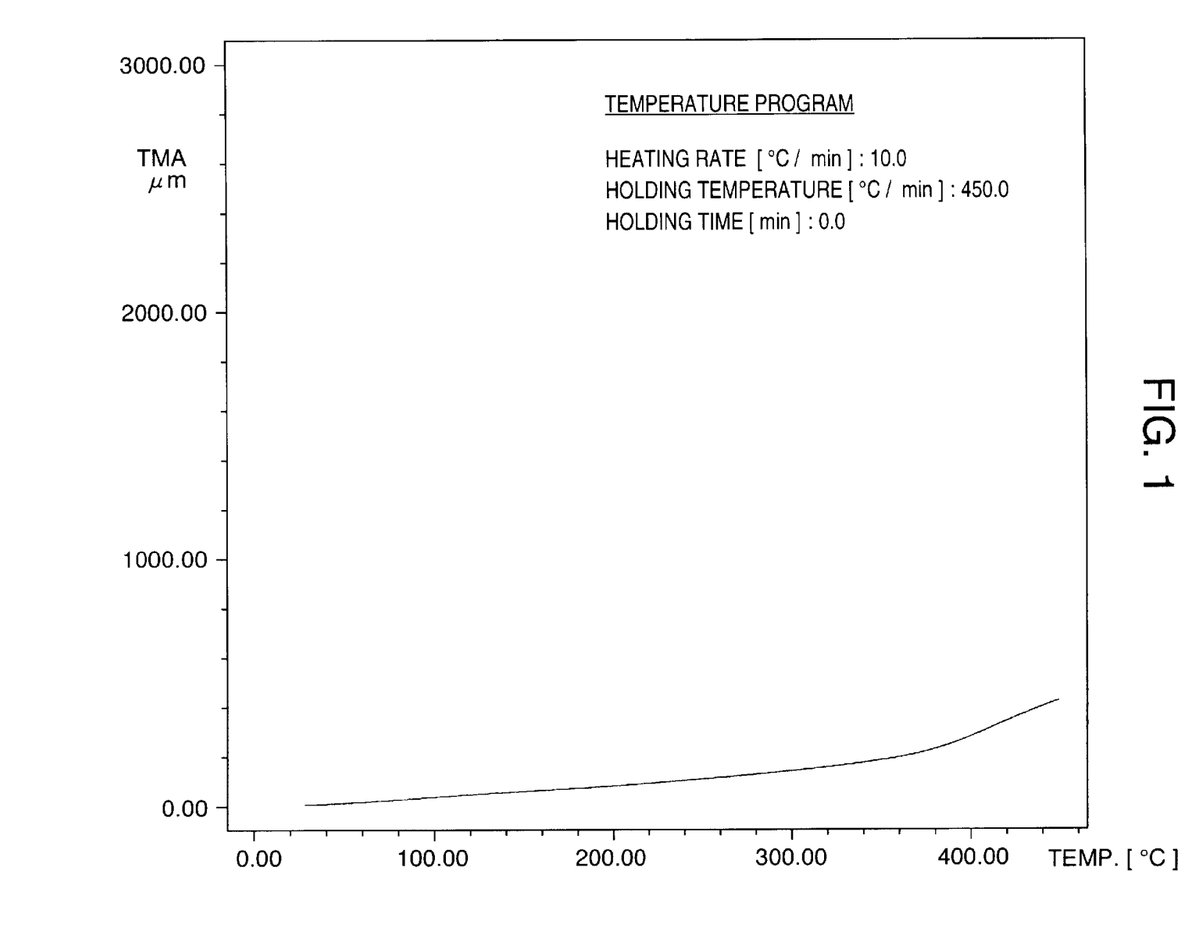
FIG. 1 is the result of TMA (measurement using a thermomechanical analyzer) using the polybenzoxazole tape of Example 10.

The above film was subjected to thermomechanical analysis in a nitrogen atmosphere at a temperature elevation rate of 10° C./min under a load of 200 mg/mm², using TMA-50 produced by Shimadzu Corporation. The measurement result is shown in FIG. 1.

The above results indicate that the polybenzoxazole obtained in Example 10 show no Tg at 400° C. or below.

INDUSTRIAL APPLICABILITY

As described above, the hydroxypolyamide of the present invention is superior in alkali solubility and patterning property and can satisfy the requirement of a high level of storage stability when made into a varnish and the dynamic properties required when used as the surface protective film or interlayer dielectric of semiconductor device.

What is claimed is:

1. A positive resist composition comprising a hydroxypolyamide represented by the following formula (I) and a photoactive component:

(I)

wherein $R_1$ and $R_3$ may be the same or different and are each a tetravalent aromatic group; $R_2$ is a bivalent aromatic group; n is an integer of 2 to 150; and Z is a monovalent organic group and at least 40% of Z is a group represented by the following structural formula (II):

—X—$R_4$—(COOH)$_m$ (II)

wherein X is a carbonyl group or a sulfonyl group; m is an integer of 0 to 3 with a proviso that m is not 0 when X is a carbonyl group; $R_4$ is an aliphatic group not including alkenyl group or alkynyl group, an alicyclic group or an aromatic group; and, when X is a carbonyl group and $R_4$ is an alicyclic group or an aromatic group, at least one of the carboxylic groups is at the ortho position.

2. A positive resist composition according to claim 1, wherein the photoactive component is a photosensitive diazoquinone compound.

3. A positive resist composition according to claim 1 or 2, wherein the X is a sulfonyl group.

4. A positive resist composition according to claim 1, wherein the $R_1$ and $R_3$ in the formula (I) are the following group:

5. A hydroxypolyamide represented by the following formula (III), for use in a positive resist:

(III)

wherein $R_1$ and $R_3$ may be the same or different and are each a tetravalent aromatic group; $R_2$ is a bivalent aromatic group; n is an integer of 2 to 150; and Z is a monovalent organic group and at least 40% of Z is a group represented by the following structural formula (IV):

—X—$R_4$—(COOH)$_m$ (IV)

wherein X is a sulfonyl group; m is an integer of 0 to 3; and $R_4$ is an aliphatic group not including alkenyl group or alkynyl group, an alicyclic group or an aromatic group.

6. A hydroxypolyamide for use in a positive resist according to claim 5, wherein the $R_1$ and $R_3$ in the formula (I) are the following group:

7. A method for forming a heat-resistant pattern, which comprises coating, on a semiconductor device, a varnish comprising a solvent and a positive resist composition containing a hydroxypolyamide represented by the following formula (I) and a photoactive component, then subjecting the coated material to prebaking, light exposure and development for patterning, and heat-curing the resulting coating film pattern:

(I)

wherein $R_1$ and $R_3$ may be the same or different and are each a tetravalent aromatic group; $R_2$ is a bivalent aromatic group; n is an integer of 2 to 150; and Z is a monovalent organic group and at least 40% of Z is a group represented by the following structural formula:

—X—$R_4$—(COOH)$_m$ (II)

wherein X is a carbonyl group or a sulfonyl group; m is an integer of 0 to 3 with a proviso that m is not 0 when X is a carbonyl group; $R_4$ is an aliphatic group not including alkenyl group or alkynyl group, an alicyclic group or an aromatic group; and, when X is a carbonyl group and $R_4$ is an alicyclic group or an aromatic group, at least one of the carboxylic groups is at the ortho position.

* * * * *